US011955097B2

(12) United States Patent
Nishimura et al.

(10) Patent No.: US 11,955,097 B2
(45) Date of Patent: Apr. 9, 2024

(54) SHIFT REGISTER, SCANNING SIGNAL LINE DRIVING CIRCUIT INCLUDING SAME, AND DISPLAY DEVICE INCLUDING SAME

(71) Applicant: Sharp Display Technology Corporation, Kameyama (JP)

(72) Inventors: Jun Nishimura, Kameyama (JP); Yoshihito Hara, Kameyama (JP); Yohei Takeuchi, Kameyama (JP); Kengo Hara, Kameyama (JP); Tohru Daitoh, Kameyama (JP)

(73) Assignee: Sharp Display Technology Corporation, Kameyama (JP)

( * ) Notice: Subject to any disclaimer, the term of this patent is extended or adjusted under 35 U.S.C. 154(b) by 0 days.

(21) Appl. No.: 18/075,307

(22) Filed: Dec. 5, 2022

(65) Prior Publication Data

US 2023/0206875 A1 Jun. 29, 2023

(30) Foreign Application Priority Data

Dec. 27, 2021 (JP) ................................. 2021-211880

(51) Int. Cl.
*G09G 3/36* (2006.01)
*G11C 19/28* (2006.01)

(52) U.S. Cl.
CPC ........... *G09G 3/3677* (2013.01); *G11C 19/28* (2013.01); *G09G 2300/0852* (2013.01); *G09G 2310/0286* (2013.01)

(58) Field of Classification Search
CPC .......... G09G 3/3677; G09G 3/20; G09G 3/36; G09G 2300/0852; G09G 2310/0286; G11C 19/28; G11C 19/18; G11C 19/184
See application file for complete search history.

(56) References Cited

U.S. PATENT DOCUMENTS

| | | | |
|---|---|---|---|
| 11,854,458 B2* | 12/2023 | Huang | G09G 3/2092 |
| 2011/0221736 A1* | 9/2011 | Pak | G09G 3/3677 345/50 |
| 2012/0200544 A1 | 8/2012 | Iwamoto et al. | |
| 2012/0320008 A1* | 12/2012 | Takahashi | G11C 19/28 345/204 |
| 2013/0169319 A1* | 7/2013 | Sasaki | G11C 19/28 327/108 |
| 2013/0194033 A1* | 8/2013 | Murakami | G05F 3/16 327/543 |
| 2018/0190201 A1* | 7/2018 | Li | G09G 3/3674 |

(Continued)

FOREIGN PATENT DOCUMENTS

WO 2011/055569 A1 5/2011

*Primary Examiner* — Christopher E Leiby
(74) *Attorney, Agent, or Firm* — ScienBiziP, P.C.

(57) ABSTRACT

A shift register includes stages each constituted by a unit circuit provided with a thin-film transistor (separation transistor) that separates a control node into an output-side first control node and an input-side second control node and a capacitor whose first end is connected to the second control node. The thin-film transistor (separation transistor) has a control terminal that is supplied with a high-level DC power supply voltage. Typically, the channel width of a thin-film transistor (first output control transistor) that controls output from a unit circuit is ten or more times greater than the channel width of the thin-film transistor (separation transistor).

10 Claims, 16 Drawing Sheets

(56) References Cited

U.S. PATENT DOCUMENTS

| | | | |
|---|---|---|---|
| 2019/0035322 A1* | 1/2019 | Kim | H01L 27/1225 |
| 2020/0074907 A1* | 3/2020 | Tagawa | G11C 19/28 |
| 2020/0135132 A1 | 4/2020 | Tanaka et al. | |
| 2020/0152283 A1* | 5/2020 | Qing | G09G 3/3266 |
| 2021/0358356 A1* | 11/2021 | Xiao | G11C 19/287 |
| 2022/0101775 A1* | 3/2022 | Na | G11C 19/28 |
| 2022/0172659 A1* | 6/2022 | Park | G09G 3/32 |
| 2023/0215381 A1* | 7/2023 | Ahn | G09G 3/3266 |
| | | | 345/204 |

\* cited by examiner

SHIFT REGISTER, SCANNING SIGNAL LINE DRIVING CIRCUIT INCLUDING SAME, AND DISPLAY DEVICE INCLUDING SAME

BACKGROUND

1. Field

The present disclosure relates to shift registers provided in driving circuits of active matrix display devices and, in particular, to a shift register in a monolithic scanning signal line driving circuit.

2. Description of the Related Art

There has conventionally been known a liquid crystal display device including a display section including a plurality of source bus lines (video signal lines) and a plurality of gate bus lines (scanning signal lines). In such a liquid crystal display device, pixel forming sections forming pixels are provided at intersections of the source bus lines and the gate bus lines. Each pixel forming section includes a thin-film transistor (TFT) that is a switching element whose gate terminal is connected to a gate bus line passing through a corresponding intersection and whose source terminal is connected to a source bus line passing through the intersection, a pixel capacitor for retaining a pixel voltage value, or other components. In the liquid crystal display device, there are also provided a gate driver (scanning signal line driving circuit) for driving the gate bus lines and a source driver (video signal line driving circuit) for driving the source bus lines.

A video signal representing a pixel voltage value is transmitted by a source bus line. However, each source bus line is unable to transmit, at one time (i.e. at the same time), video signals representing pixel voltage values for a plurality of rows. For this reason, writing (charging) of video signals to the pixel capacitors in a plurality of the pixel forming sections provided in the display section is sequentially executed row by row. This is achieved by the gate driver being constituted by a shift register including a plurality of stages so that the plurality of gate bus lines are sequentially selected every predetermined period of time. Moreover, active scanning signals are sequentially outputted from the plurality of stages, whereby as mentioned above, writing of video signals to the pixel capacitors is sequentially executed row by row.

While it has conventionally been often that gate drivers are mounted as integrated circuit (IC) chips in peripheral sections of substrates constituting liquid crystal panels, more and more gate drivers have recently been formed directly on top of substrates. Such a gate driver is called "monolithic gate driver". Further, liquid crystal display device including TFTs (hereinafter referred to as "IGZO-TFTs") whose channel layers are formed by indium gallium zinc oxide, which is an oxide semiconductor composed mostly of indium (In), gallium (Ga), zinc (Zn), and oxygen (O), is currently under development.

It should be noted t circuits separately constituting each of the stages of the shift register are hereinafter referred to as "unit circuits". Further, although either the drain or source of an n-channel thin-film transistor, whichever is higher in potential, is called "drain", thin-film transistors in the unit circuits that are described below include a thin-film transistor whose drain and source are interchanged. Accordingly, one of two terminals that function as a drain or a source is referred to as "first conducting terminal", and the other as "second conducting terminal". Further, a terminal that functions as the gate of a thin-film transistor is referred to as "control terminal". Note, however, that the terms "gate", "drain", and "source" are used when appropriate.

FIG. 15 is a circuit diagram showing an example configuration of a conventional unit circuit included in a monolithic gate driver. This unit circuit includes three thin-film transistors T91 to T93 and one capacitor (capacitive element) C91. Further, this unit circuit has three input terminals 91 to 93 and one output terminal 99 as well as an input terminal for a low-level DC power supply voltage VSS. To the input terminal 91, an output signal from a unit circuit constituting a preceding stage is supplied as a set signal S. To the input terminal 92, an output signal from a unit circuit constituting a subsequent stage is supplied as a reset signal R. To the input terminal 93, one of a plurality of clock signals that bring a shift register into operation is supplied as an input clock signal CLKin. From the output terminal 99, an output signal Q to serve as a scanning signal is outputted. It should be noted that a node connected to the control terminal of the thin-film, transistor T93 is referred to as "control node", and the control node is denoted by reference sign NA.

Ideal operation of the unit circuit shown in FIG. 15 is described with reference to FIG. 16. In a period preceding a point in time t91, the potential of the control node NA and the potential of the output signal Q (i.e. the potential of the output terminal 99) are at a low level.

At the point in time t91, the set signal S changes from a low level (OFF level) to a high level (ON level). Since the thin-film transistor T91 is diode-connected as shown in FIG. 15, the change of the set signal S to a high level brings the thin-film transistor T91 into an ON state, so that the capacitor C91 is charged. This causes the potential of the control node NA to change from a low level to a high level, bringing the thin-film transistor T93 into an ON state. Note here that during a period from the point in time t91 to a point in time t92, the input clock signal CLKin is maintained at a low level. For this reason, during this period, the output signal Q is maintained at a low level.

At the point in time t92, the input clock signal CLKin changes from a low level to a high level. At this point in time, since the thin-film transistor T93 is in an ON state, the potential of the output terminal 99 rises as the potential the input terminal 93 rises. Note here that since the capacitor C91 is provided between the control node NA and the output terminal 99 as shown in FIG. 15, the potential of the control node NA rises (i.e. the control node NA becomes boosted) as the potential e output terminal 99 rises. As a result, a high voltage is applied to the thin-film transistor T93, and the potential of the output signal Q rises to a level sufficient for a gate bus line connected to the output terminal 99 to become selected.

At a point in time t93, the input clock signal CLKin changes from a high level to a low level. This causes the potential of the output terminal 99 to drop as the potential of the input terminal 93 drops. That is, the potential of the output signal Q is brought to a low level. Further, the potential of the control node NA drops too via the capacitor C91.

At a point in time t94, the reset signal R changes from a low level to a high level. This brings the thin-film transistor T92 into an ON state. As a result, the potential of the control node NA is brought to a low level.

Execution of such an operation in all unit circuits constituting the shift register causes the plurality of gate bus lines to sequentially become selected every predetermined period of time. It should be noted that while International Publication No. 2011/055569 discloses unit circuits of various configurations, an operation such as that mentioned above is basically executed for any unit circuit.

Incidentally, as for a monolithic gate driver including the aforementioned IGZO-TFTs, a circuit is configured on the premise that when the gate-source voltage Vgs of a thin-film transistor is 0 V, the thin-film transistor is in an OFF state (that is, the drain-source current is substantially 0). However, due to a recent increase in mobility IGZO-TFTs, there has been a case where the characteristics of a thin-film transistor is a unit circuit change from enhanced characteristics to depression characteristics. If a thin-film transistor has depression characteristics, a current of non-negligible magnitude flows between the drain and source of the thin-film transistor when the gate-source voltage Vgs is 0 V. This may cause an operational abnormality to occur. Further, in a monolithic gate driver corresponding to a configuration in which an in-cell touch panel is mounted, such a voltage stress is applied to a thin-film transistor that a threshold voltage shifts in a negative direction. This raises concern that the characteristics of a thin-film transistor in a unit circuit may change from enhanced characteristics to depression characteristics during use of the device so that an operational abnormality may occur. The following describes, with reference to FIG. 17, operational abnormalities that occur when the characteristics of a thin-film transistor in the unit circuit shown in FIG. 15 change from enhanced characteristics to depression characteristics.

As mentioned above, at the point in time t92, the input clock signal CLKin changes from a low level to a high level, whereby the potential of the output terminal 99 (i.e. the potential of the output signal Q) and the potential of the control node NA rise. Note here that if the thin-film transistor T91 has depression characteristics, a leak current is produced n he thin-film transistor T91. Similarly, if the thin-film transistor T92 has depression characteristics, a leak current is produced in the thin-film transistor T92. When such a leak current is produced, the potential control node NA drops at and after the point in time t92 as indicated by a portion denoted by reference sign 901 in FIG. 17.

At the point in time t93, the input clock signal CLKin changes from a high level to a low level. At this point in time, if the potential of the control node NA drops at and after the point in time t92 due to a leak current the thin-film transistor T91 or T92, thin-film transistor T93 is low in discharge capacity. As a result, the potential of the output signal Q gradually drops at and after the point time t93 unlike an ideal waveform shown in FIG. 16 (see a potion denoted by reference sign 902 in FIG. 17). When the waveform of the output signal Q becomes a waveform that is different from the ideal waveform, an operational abnormality occurs.

It should be noted that U.S. Patent Application Publication No. 2020/0135132 discloses, in relation to a unit circuit included in a monolithic gate driver, a configuration in which a thin-film transistor T94 is provided as schematically shown in FIG. 18 so that the control node NA is separated into two control nodes (namely a first control node NA1 and a second control node NA2).

According to the unit circuit configured as shown a high-level DC power supply voltage VDD is supplied to the control terminal of the thin-film transistor T94. Therefore, when the potential of the first control node NA1 rises due to a boost operation at the point in time t92 in FIG. 16 or 17, the thin-film transistor T94 is brought into an OFF state. Accordingly, the potential of the second control node NA2 does not rise at and after the point in time t92. This restrains a high voltage from being applied between the first and second conducting terminals of the thin-film transistor T91 or T92.

However, in a case where a leak current is produced in the thin-film transistor T91 or T92, the potential of the second control node NA2 drops during a period from the point in time t92 to the point in time t93. in FIG. 16 or 17, whereby the thin-film transistor T94 is brought into an ON state. This causes the potential of the first control node NA1 to drop too, so that the waveform of the output signal Q becomes a waveform that is different from the ideal waveform. That is, an operational abnormality occurs.

It is desirable to achieve a shift register that is capable of restraining the occurrence of an operational abnormality attributed to a leak current in a transistor whose conducting terminal is connected to a control node (i.e. a node that controls output from a unit circuit).

SUMMARY

According to an aspect of the disclosure, there is provided a shift register including a plurality of stages that operate in accordance with a plurality of clock signals, wherein each of the stages is constituted by a unit circuit including a first output node, a first control node, a second control node, a first output control transistor having a control terminal connected to the first control node, a first conducting terminal that is supplied with an input clock signal that is one of the plurality of clock signals, and a second conducting terminal connected to the first output node, a set transistor having a control terminal that is supplied with a set signal that is an output signal that is outputted from a unit circuit constituting a preceding stage, a first conducting terminal that is supplied with the set signal o an ON-level potential, and a second conducting terminal connected to the second control node, a reset transistor having a control terminal that is supplied with a reset signal that is an output signal that is outputted from a unit circuit constituting a subsequent stage, a first conducting terminal connected to he second control node, and a second conducting terminal that is supplied with an OFF-level potential, a separation transistor having a control terminal that is supplied with an ON-level potential, a first conducting terminal connected to the first control node, and a second conducting terminal connected to the second control node, a first capacitor having whose first end is connected to the first control node and whose second end is connected to the first output node, and a second capacitor whose first end is connected to the second control node.

According to an aspect of the disclosure, there is provided a scanning signal line driving circuit fog driving a plurality of scanning signal lines disposed in a display section that displays an image, the scanning signal line driving circuit including the shift register configured as just described, wherein the plurality of stages are constituted by a plurality of unit circuits provided in one-to-one correspondence with the plurality of scanning signal lines, and the first output node included in each of the unit circuits is connected to a corresponding scanning signal line.

According to an aspect of the disclosure, there is provided a display device including a display section that displays an image and the scanning signal line driving circuit configured as just described.

DESCRIPTION OF THE EMBODIMENTS

The following describes embodiments with reference to the accompanying drawings.

1. Overall Configuration of Overview of Operation

Figure 2:
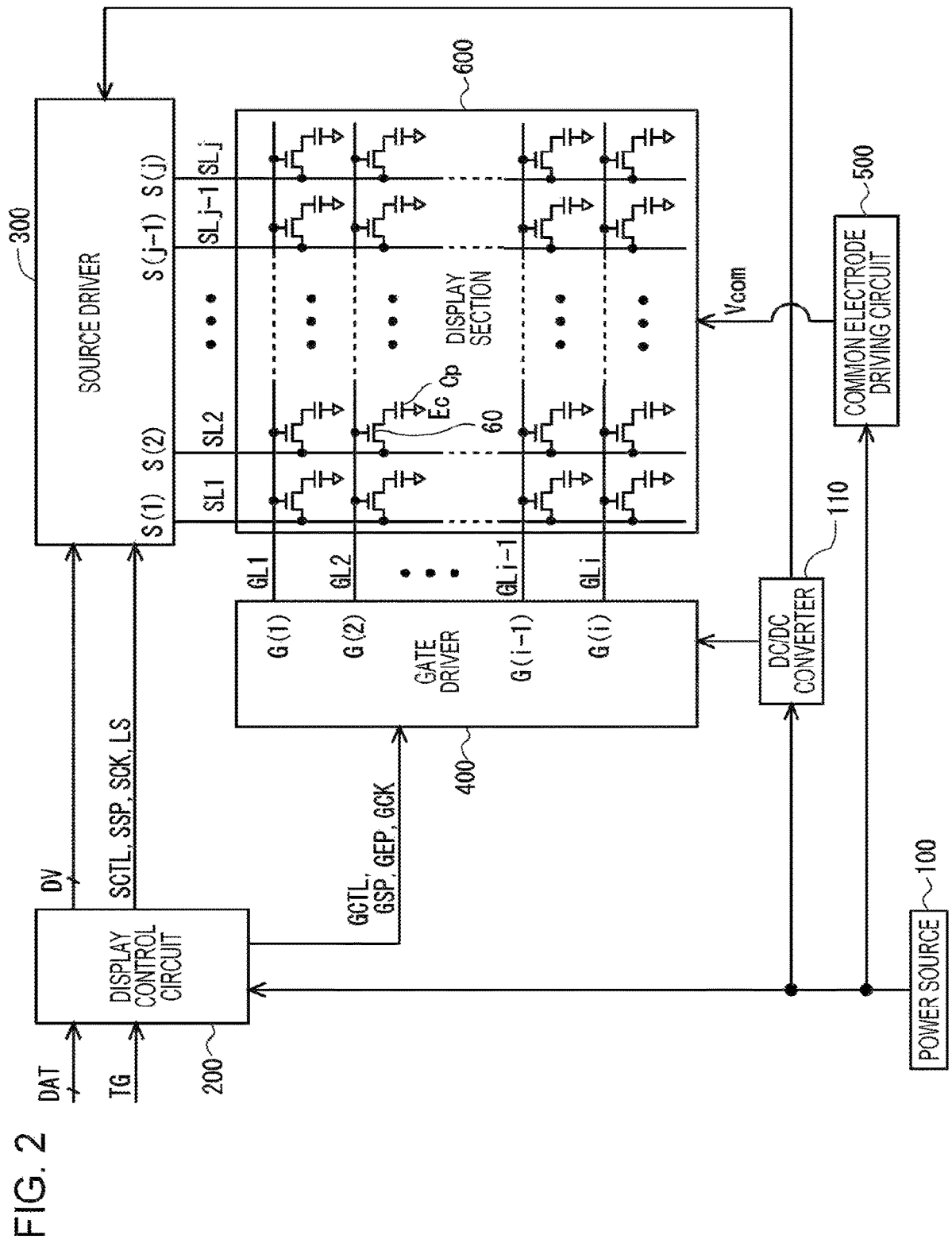
FIG. 2 is a block diagram showing an overall configuration of a liquid crystal display device according to all embodiments.

FIG. 2 is a block diagram showing an overall configuration of a liquid crystal display device according to all embodiments. As shown in FIG. 2, this liquid crystal display device includes a power source 100, a DC/DC converter 110, a display control circuit 200, a source driver (video signal line driving circuit) 300, a gate driver (scanning signal line driving circuit) 400, a common electrode driving circuit 500, and a display section 600. The gate driver 400 and the display section 600 are formed on top of an identical substrate (i.e. a TFT substrate that is one of two substrates that constitute a liquid crystal panel). That is, the gate driver 400 is a monolithic gate driver.

The display section 600 has formed therein a plurality of (j) source bus lines (video signal lines) SL1 to SLj, a plurality of (i) gate bus lines (scanning signal lines) GL1 to GLi, and a plurality of (i×j) pixel forming sections provided separately in correspondence with each of intersections of the plurality of source bus lines SL1 to SLj and the plurality of gate bus lines GL1 to GLi. The plurality of pixel forming sections are arranged in a matrix to constitute a pixel array. Each pixel forming section includes a thin-film transistor (TFT) 60 that is a switching element whose gate terminal is connected to a gate bus line passing through a corresponding intersection and whose source terminal is connected to a source bus line passing through the intersection, a pixel electrode connected to a drain terminal of the thin-film transistor 60, a common electrode Ec that is a counter electrode commonly provided in the plurality of pixel forming sections, and a liquid crystal layer commonly provided in the plurality of pixel forming section and sandwiched between the pixel electrode and the common electrode Ec. Moreover, the pixel electrode and the common electrode Ec form a liquid crystal capacitor that constitutes a pixel capacitor Cp it should be noted that in general, an auxiliary capacitor s provided in parallel with the liquid crystal capacitor in order to certainly retain charge in the pixel capacitor Cp.

As the thin-film transistor 60, a thin-film transistor (oxide TFT) having a channel layer formed by an oxide semiconductor is employed. As the oxide TFT, for example, an IGZO-TFT (i.e. a thin-film transistor having a channel layer formed by an oxide semiconductor containing indium, gallium, zinc, and oxygen) is employed. In these respects, the same applies to a thin-film transistor in the gate driver 400.

The power source 100 supplies a predetermined power supply voltage to the DC/DC converter 110, the display control circuit 200, and the common electrode driving circuit 500. The DC/DC converter 110 generates, from the power supply voltage, DC voltages (namely a high-level DC power supply voltage VDD and a low-level DC power supply voltage VSS) for bringing the source driver 300 and the gate driver 400 into operation, and supplies the DC power supply voltages to the source driver 300 and the gate driver 400. The common electrode driving circuit 500 supplies a common electrode driving voltage Vcom to the common electrode Ec.

The display control circuit 200 receives an image signal DAT and a timing signal group TG such as a horizontal synchronizing signal and a vertical synchronizing signal from an outside source and outputs a digital video signal DV, source control signals SCTL for controlling operation of source driver 300, and gate control signals GCTL for controlling operation of the gate driver 400. The source control signals SCTL include a source start pulse signal SSP, a source clock signal SCK, and a latch strobe signal LS. The gate control signals GCTL include a gate start pulse signal GSP, a gate end pulse signal GEP, and a gate clock signal GCK.

The source driver 300 applies driving video signals S(1) to S(j) to the source bus lines SL1 to SLj in accordance with the digital video signal DV and the source control signals SCTL, which are sent from the display control circuit 200. At this point in time, the source driver 300, digital video signals DV representing voltages to be applied separately to each of the source bus lines SL are sequentially retained at the timings of generation of pulses of the source clock signal SCK. Then, the digital video signals DV thus retained are converted into analog voltages at the timings of generation of pulses of the latch strobe signal LS. The analog voltages thus obtained are applied at once to all source bus lines SL1 to SLj as the driving video signals S(1) to S(j).

In accordance with the gate control signals GCTL, which are sent from the display control circuit 200, the gate driver 400 repeats the application of active scanning signals G(1) to G(i) separately to each of the gate bus lines GL1 to GLi with one vertical scanning period as a cycle. The gate driver 400 will be described in detail later.

In this way, the driving video signals S(1) to S(j) are applied to the source bus lines SL1 to SLj, and the scanning signals G(1) to G(i) are applied to the gate bus lines GL1 to GLi, whereby an image based on the image signal DAT sent from the outside source is displayed on the display section 600.

2. Schematic Configuration of Gate Driver

Figure 3:
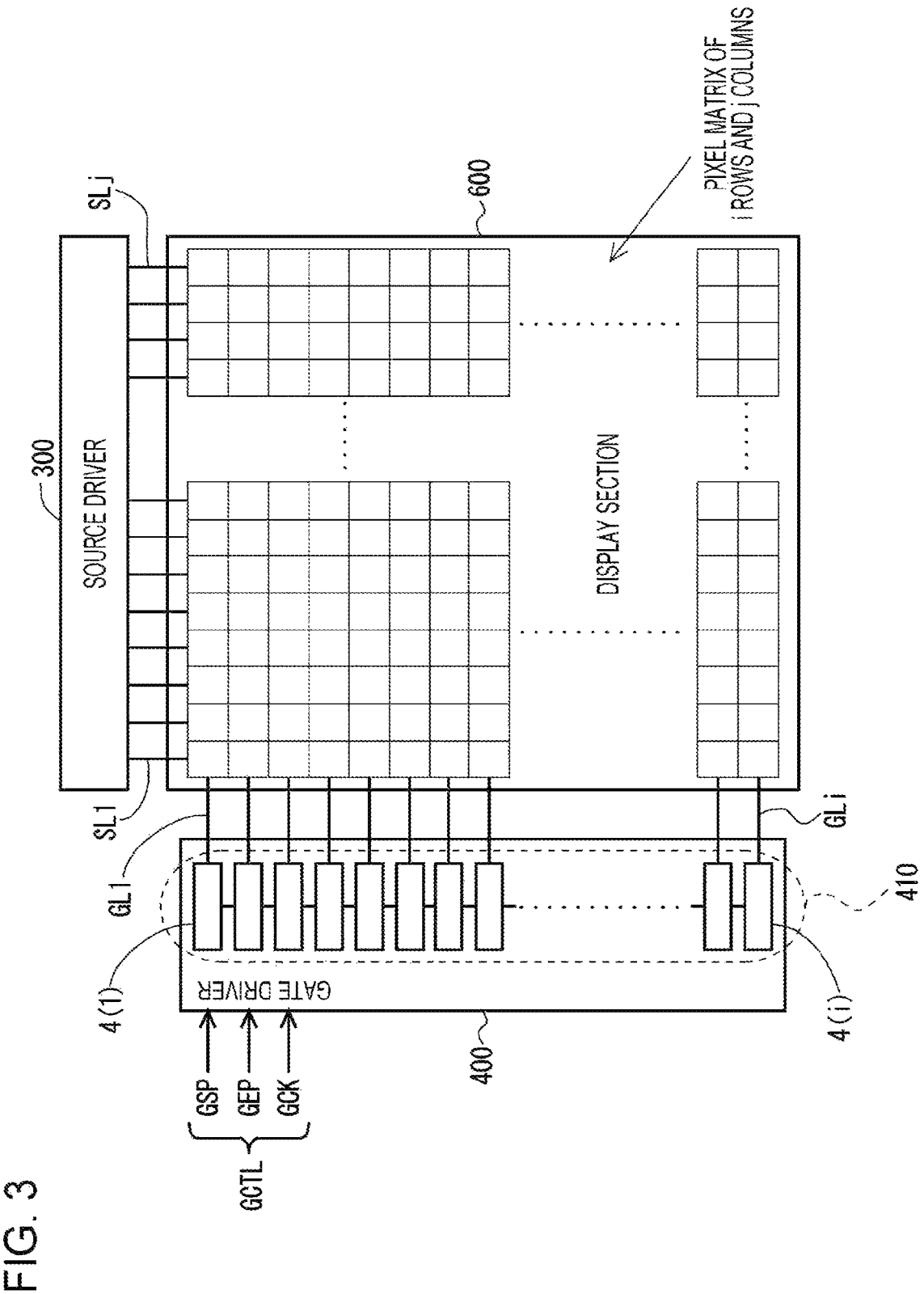
FIG. 3 is a block diagram for explaining a schematic configuration of a gate driver according to all embodiments.

FIG. 3 is a block diagram for explaining a schematic configuration of the gate driver 400 according to all embodiments. As shown in FIG. 3, the gate driver 400 is constituted by a shift register 410 including a plurality of stages. While the display section 600 has formed therein a pixel matrix of i rows by j columns, the stages of the shift register 410 are provided separately in one-to-one correspondence with each of the rows of the pixel matrix. That is, the shift register 410 includes i unit circuits 4(1) to 4(i). It should be noted that there is a case where a unit circuit may be provided as a dummy stage preceding the first stage or following ith stage, this case is not described, as such a case is irrelevant to the subject matter of the present disclosure. The following describes the configuration and operation of the gate driver 400 in detail.

Figure 4:
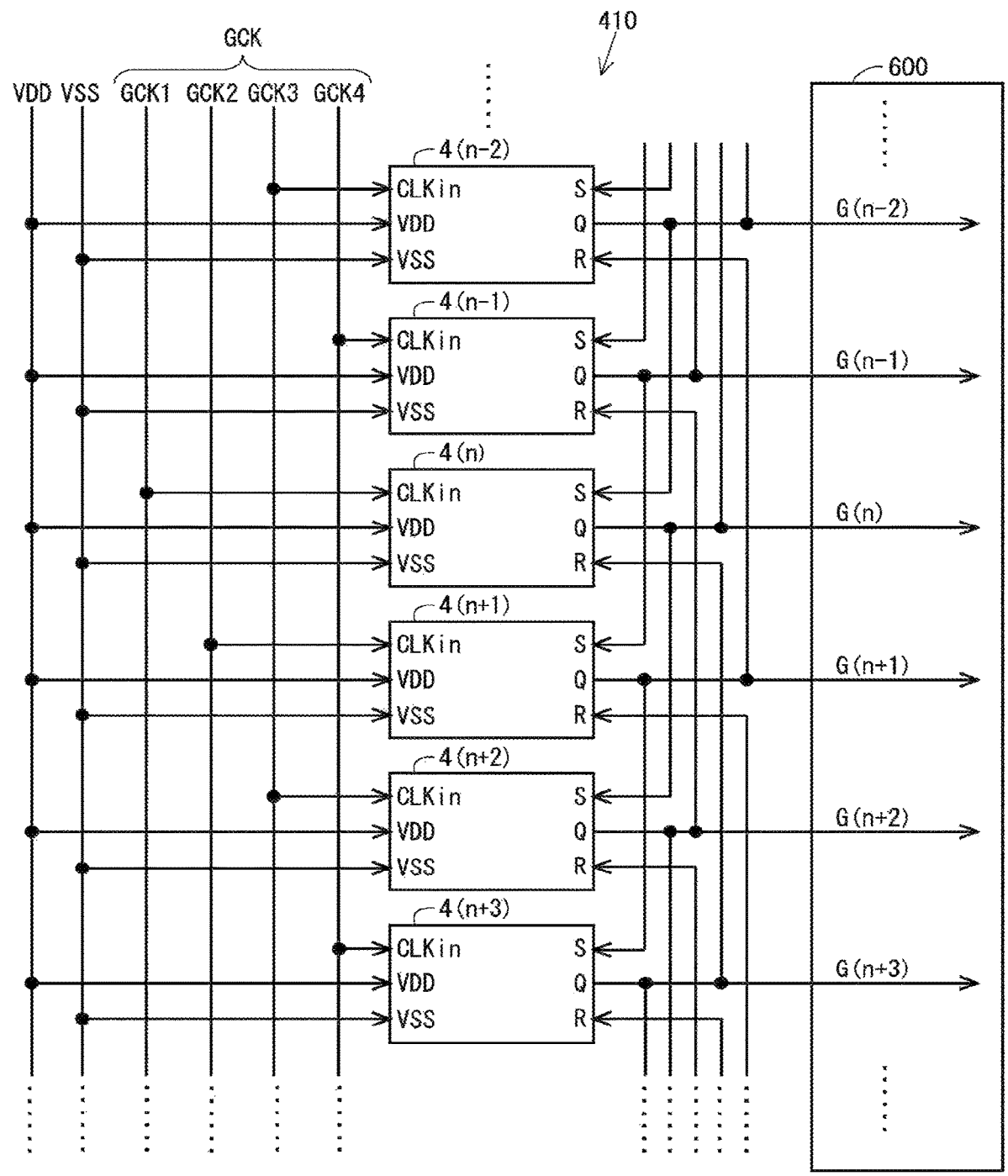
FIG. 4 is a block diagram showing a configuration of a shift register in the gate driver according to all embodiments.

FIG. 4 is a block diagram showing the configuration of the shift register 410 in the gate driver 400. As mentioned above, the shift register 410 is constituted by the i unit circuits 4(1) to 4(i). Note, however, that FIG. 4 shows the (n−2)th to (n+3)th unit circuits 4(n−2) to 4(n+3). In the following, a unit circuit is denoted by reference sign 4 in a case where there is no need to distinguish the i unit circuits 4(1) to 4(i) from one another.

The shift register 410 is supplied with the gate start pulse signal GSP (not illustrated in FIG. 4), the gate end pulse signal GEP (not illustrated in FIG. 4), and the gate clock signal GCK as the gate control signals GCTL. The gate clock signal GCK specifically includes four clock signals GCK1 to GCK4 of different phases. Of those Tour clock signals GCK1 to GCK4, clock signals (hereinafter referred to as "input clock signals") that are inputted separately to each of the unit circuits 4 are denoted by reference sign CLKin. Further, the shift register 410 is also supplied with the DC power supply voltage VSS and the DC power supply voltage VDD.

The following signals are supplied to the input terminals of each stage (i.e. each unit circuit 4) of the shift register 410 (see FIG. 4). As for the gate clock signals, the clock signal GCK3 is supplied to the (n−2)th unit circuit 4(n−2), clock signal GCK4 is supplied to the (n−1)th unit circuit 4(n−1) the clock signal GCK1 supplied to the nth unit circuit 4(n), and the clock signal GCK2 is supplied to the (n+1)th unit circuit 4(n+1). Such a configuration is repeated every four stages throughout all stages of the shift register 410. It should be noted that the clock signal GCK1 and the clock signal GCK3 are 180 degrees out of phase with each other, that the clock signal GCK2 and the clock signal GCK4 are 180 degrees out of phase with each other, and that the phase of he clock signal GCK1 is 90 degrees ahead of the phase of the clock signal GCK2. As can be seen from FIG. 4, to the nth unit circuit 4(n), an output signal Q(n−2) outputted from the .second previous unit circuit 4(n−2) to the nth unit circuit 4(n) is supplied as a set signal S, and an output signal Q(n+3) outputted from the third subsequent unit circuit 4(n+3) to the nth U it circuit 4(n) is supplied as a reset signal R. The same applies to a unit circuit 4 other than the nth unit circuit 4(n). The DC power supply voltage VSS and the DC power supply voltage VDD are commonly supplied to all unit circuits 4(1) to 4(i).

An output signal Q is outputted from the output terminal of each stage. (i.e. each unit circuit 4) of the shift register 410 (see FIG. 4). An output signal Q outputted from the nth unit circuit 4(n) is supplied as the scanning signal G(n) to the gate bus line GLn, supplied as a reset signal R to the third previous unit circuit 4(n−3) the nth unit circuit 4(n), and supplied as a set signal S to the second subsequent unit circuit 4(n+2) to the nth unit circuit 4(n). The same applies to an output signal Q outputted from a unit circuit 4 other than the nth unit circuit 4(n).

Figure 5:
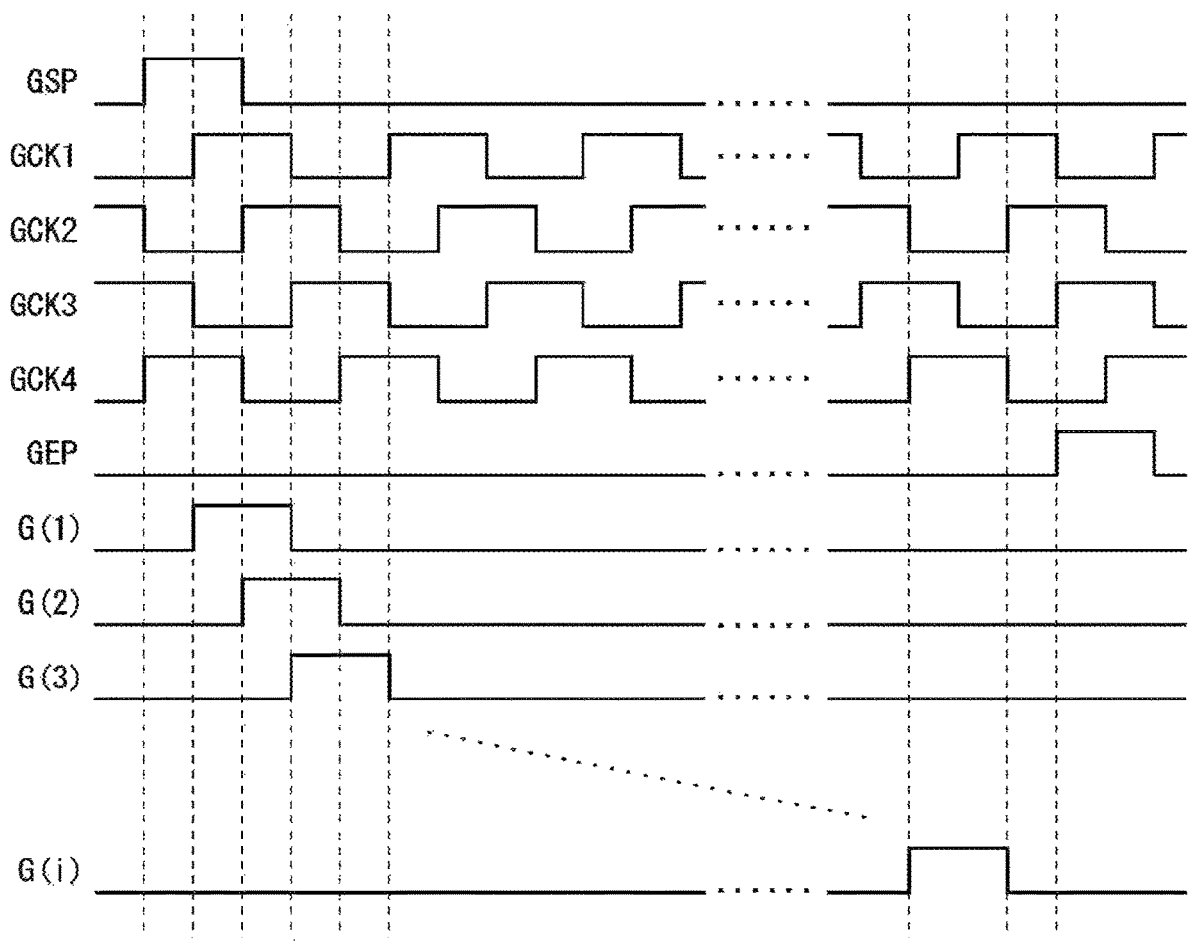
FIG. 5 is a signal waveform chart for explaining operation of the gate driver according to all embodiments.

FIG. 5 is a signal waveform chart for explaining operation of the gate driver 400. In the aforementioned configuration, when a pulse of the gate start pulse signal GSP is supplied to the shift register 410, shift pulses included in output signals Q outputted separately from each of the unit circuits 4 are transferred in accordance with clock operations of the four clock signals GCK1 to GCK4. That is, output signals Q outputted from the first to ith unit circuits 4(1) to 4(i) are sequentially brought to a high level. Thus, as shown in FIG. 5, the scanning signals G(1) to G(i), which are sequentially brought to a high level (i.e. become active) every predetermined period of time, are supplied to the gate bus lines GL1 to GLi in the display section 600. That is, the i gate bus lines GL1 to GLi sequentially become selected. After that, a pulse of the gate end pulse signal GEP is supplied to the shift register It should be noted that although an example is given here in which an output signal Q outputted from each unit circuit 4 is supplied as a reset signal R to the third previous unit circuit 4 to the unit circuit 4 and supplied as a set signal S to the second subsequent unit circuit 4 to the unit circuit, this is not intended to impose any limitation. Further, although an example is given here in which the four clock signals GCK1 to GCK4 are used as the gate dock signal GCK, the number of clock signals that constitute the gate clock signal GCK is not limited to 4.

3. Unit Circuit

The following describes the configuration and operation of a unit circuit for each embodiment.

3.1 First Embodiment 3.1.1 Circuit Configuration

Figure 1:
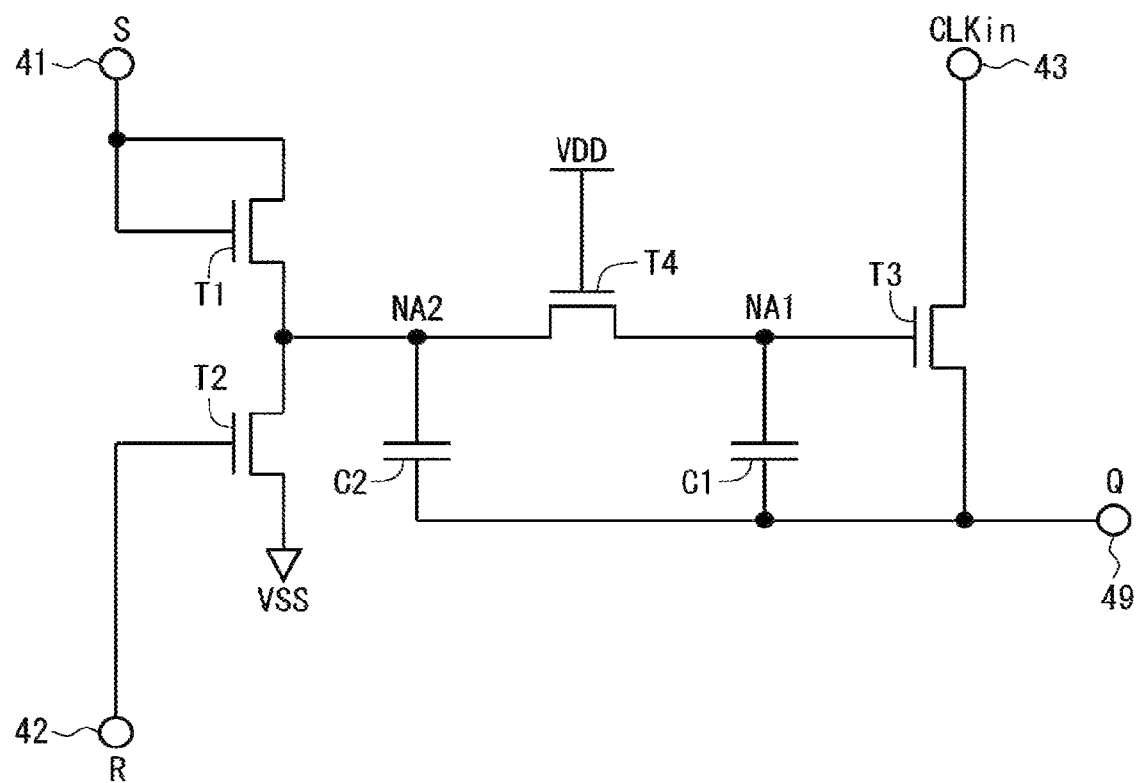
FIG. 1 is a circuit diagram showing a configuration of a unit circuit (i.e. a configuration of one stage of a shift register) according to a first embodiment.

FIG. 1 is a circuit diagram showing a configuration of a unit circuit 4 (i.e. a configuration of one stage of the shift register 410) according to the present embodiment. As shown in FIG. 1, the unit circuit 4 includes four thin-film transistors T1 to T4 and two capacitors (capacitive elements) C1 and C2. The thin-film transistors T1 to T4 are n-channel IGZO-TFTs. Further, the unit circuit 4 has three input terminals 41 to 43 and one output terminal 49 as well as an input terminal for a low-level DC power supply voltage VSS and an input terminal for a high-level DC power supply voltage VDD. Note here that an input terminal through which to receive a set signal S is denoted by reference sign 41, that an input terminal through which to receive a reset signal R is denoted by reference sign 42, and that an input terminal through which to receive an input clock signal CLKin is denoted by reference sign 43. Further, an output terminal through which to output an output signal Q is denoted by reference sign 49.

The control terminal of the thin-film transistor T3, the first conducting terminal of the thin-film transistor T4, and a first end of the capacitor ate connected to one another via the first control node NA1. The second conducting terminal of the thin-film transistor T1, the first conducting terminal of the thin-film transistor T2, the second conducting terminal of the thin-film transistor T4, and a first end of the capacitor C2 are connected to one another via the second control node NA2.

As for the thin-film transistor T1, the control terminal and the first conducting terminal are connected to the input terminal 41 (i.e. diode-connected), and the second conducting terminal is connected to the second control node NA2. It should be noted that the first conducting terminal of the thin-film transistor T1 may be connected to the input terminal for a nigh-level DC power supply voltage VDD. As for the thin-film transistor T2, the control terminal is connected to the input terminal 42, the first conducting terminal is connected to the second control node NA2, and the second conducting terminal is connected to the input terminal for a low-level DC power supply voltage TSS. As for the thin-film transistor T3, the control terminal is connected to the first control node NA1, the first conducting terminal is connected to the input terminal 43, and the second conducting terminal is connected to the output terminal 49. As for the thin-film transistor T4, the control terminal is connected to the input terminal for a high-level DC power supply voltage VDD, the first conducting terminal is connected to the first control node NA1, and the second conducting terminal is connected to the second control node NA2.

The capacitor C1 has its first end connected to the first control node NA1 and its second end connected to the output terminal 49. The capacitor C2 has its first end connected to the second control node NA2 and its second end connected to the output terminal 49.

In such a configuration, the channel width of the thin-film transistor T3 is ten or more times greater an the channel width of the thin-film transistor T4 Accordingly, the thin-film transistor T3 is sufficiently higher in driving capacity than the thin-film transistor T4.

In the present embodiment, a set transistor is achieved by the thin-film transistor T1, a reset transistor is achieved by the thin-film transistor T2, a first output control transistor is achieved by the thin-film transistor T3, a separation transistor is achieved by the thin-film transistor T4, a first capacitor is achieved by the capacitor C1, a second capacitor is achieved by the capacitor C2, and a first output node is achieve by the output terminal 49.

3.1.2 Operation

Operation of a unit circuit 4 according to the present embodiment is described with reference to FIG. 6. In a period preceding a point in time t11, the potential of the first control node NA1, the potential of the second control node NA2, and the potential of the output signal Q (i.e. the potential of the output terminal 49) are at a low level (OFF level). It should be noted that in the period preceding the point in time t11, the thin-film transistor T4 is maintained in an ON state.

At the point in time t11, the set signal S changes from a low level to a high level (ON level). Since the thin-film transistor T1 is diode-connected as shown in FIG. 1, the change of the set signal S to a high level brings the thin-film transistor T1 into an ON state, so that the capacitor C2 is charged. This causes the potential of the second control node NA2 to change from a low level to a high level. At this point in time, since the thin-film transistor T4 is it an ON state, the capacitor C1 is charged, so that the potential of the first control node NA1 changes from a low level to a high level too. This brings the thin-film transistor T3 into an ON state. Note here that during a period from the point in time t11 to a point in time t12, the input clock signal CLKin is maintained at a low level. For this reason, during this period, the output signal Q is maintained at a low level.

At the point in time t12, the set signal S changes from a high level to a low level. This brings the thin-film transistor T1 into an OFF state. Further, at the point in time t12, the input clock signal CLKin changes from a low level to a high level. At this point in time, since thin-film transistor T3 is in an ON state, the potential of the output terminal 49 rises as the potential of the input terminal 43 rises. Note here that since the capacitor C1 is provided between the first control node NA1 and the output terminal 49 as shown in FIG. 1, the potential of the first control node NA1 rises (that is, the first control node NA1 becomes boosted) as the potential of the output terminal 49 rises. As a result, a high voltage is applied to the thin-film transistor 73, and the potential of the output signal Q rises to a level sufficient for a gate bus line GL connected to the output terminal 49 to become selected. Further, since the capacitor C2 is provided between the second control node NA2 and the output terminal 49 as shown in FIG. 1, the potential of the second control node NA2 rises (that is, the second control node NA2 becomes boosted) as the potential of the output terminal 49 rises. Incidentally, the thin-film transistor T4 is brought into an OFF state when the voltage between the control terminal and the first conducting terminal and the voltage between the control terminal and the second conducting terminal become equal to or lower than a threshold due to the rises in potential of the first and second control nodes NA1 and NA2. This renders the first control node NA1 and the second control node NA2 electrically separated from each other.

At a point in time t13, the input clock signal CLKin changes from a high level to a low level. This causes the potential of the the output terminal 49 to drop as the potential of the input terminal 43 drops. That is, the potential of the output signal Q is brought to a low level. Further, the potential of the first control node NA1 drops via the capacitor C1, and the potential of the second control node NA2 drops via the capacitor C2.

At a point in time t14, the reset signal R changes from a low level to a high level. This brings the thin-film transistor T2 into an ON state, bringing the potential of the second control node NA2 to a low level. Further, the voltage between the control terminal and second conducting terminal of the thin-film transistor T4 becomes higher than the threshold voltage, so that the thin-film transistor T4 is brought into an ON state. This brings the potential of the first control node NA1 to a low level too.

3.1.3. Effects

Figure 6:
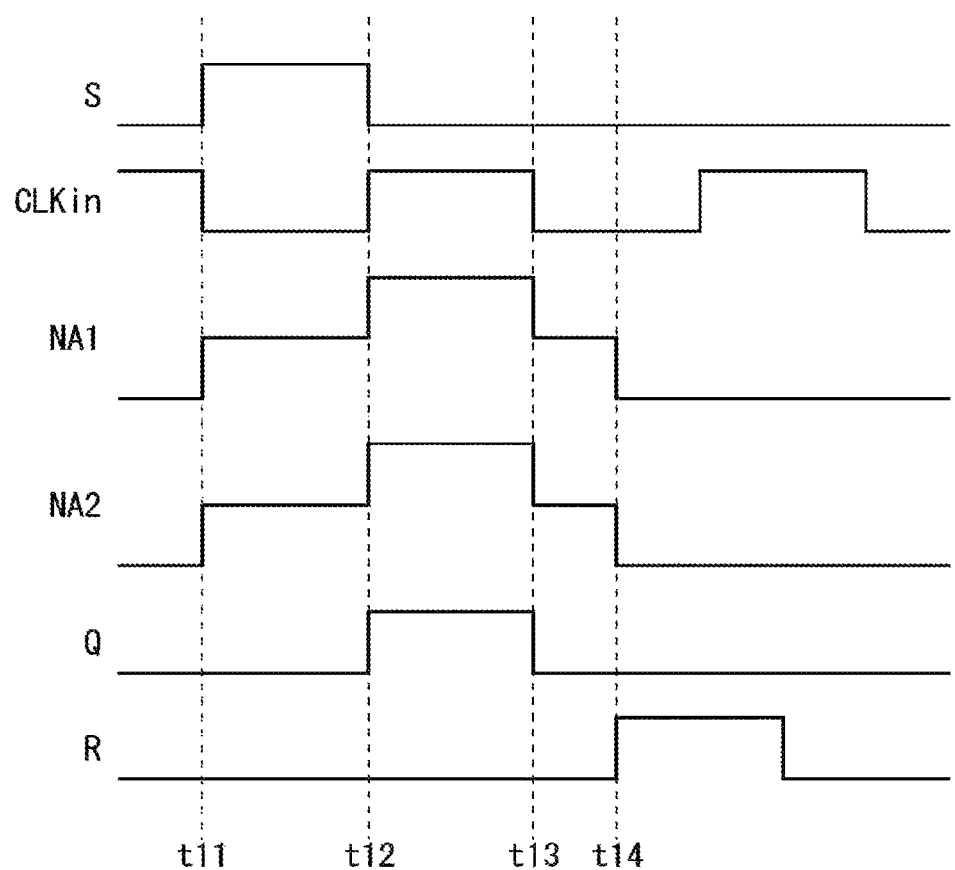
FIG. 6 is a signal waveform chart for explaining operation of a unit circuit according to the first embodiment.

Regarding an operation of changing the potential of the output signal Q (i.e. the potential of the output terminal 49) from a high level to a low level, the discharge capacity of the thin-film transistor T3 depends on the potential of the first control node NA1 immediately before a point in time where the input clock signal CLKin changes from a high level to a low level (i.e. the point in time t13 in FIG. 6). If the potential of the first control node NA1 is sufficiently high, the potential of the output signal Q quickly changes from a high level to a low level in response to the change of the input clock signal from a high level to a low level.

Figure 15:
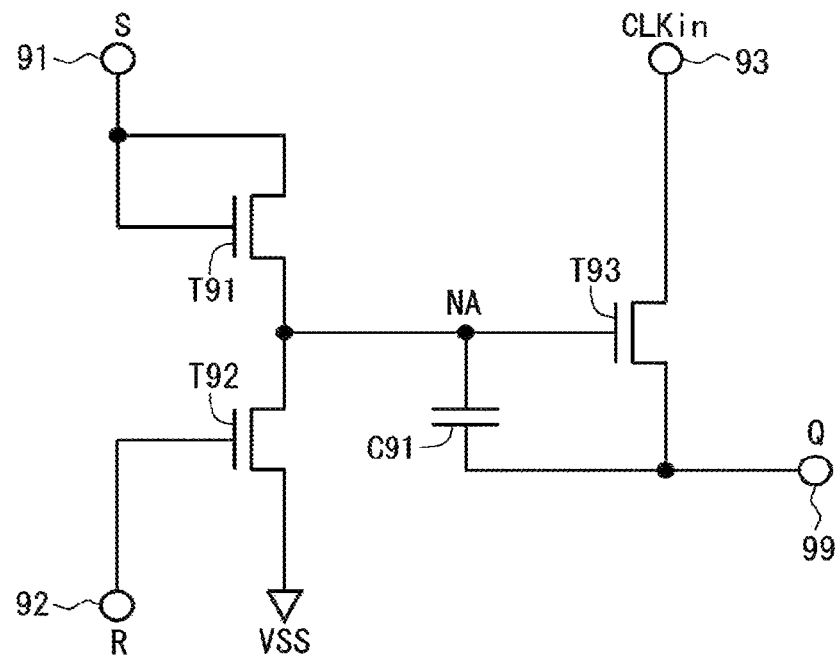
FIG. 15 is a circuit diagram showing an example configuration of a conventional unit circuit.
Figure 16:
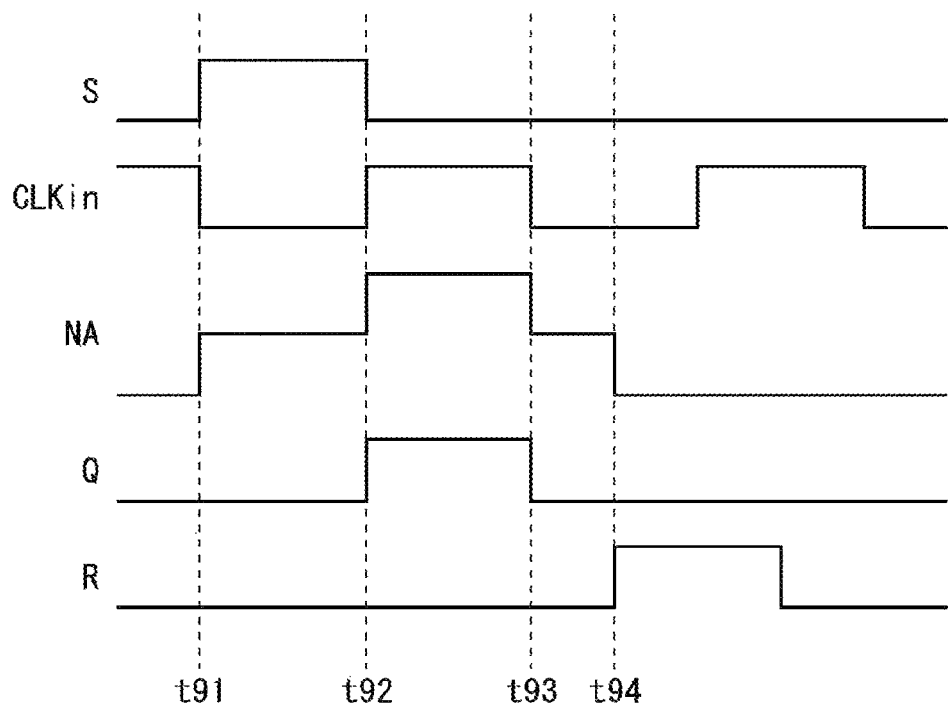
FIG. 16 is a signal waveform chart for explaining operation of a conventional unit circuit.
Figure 17:
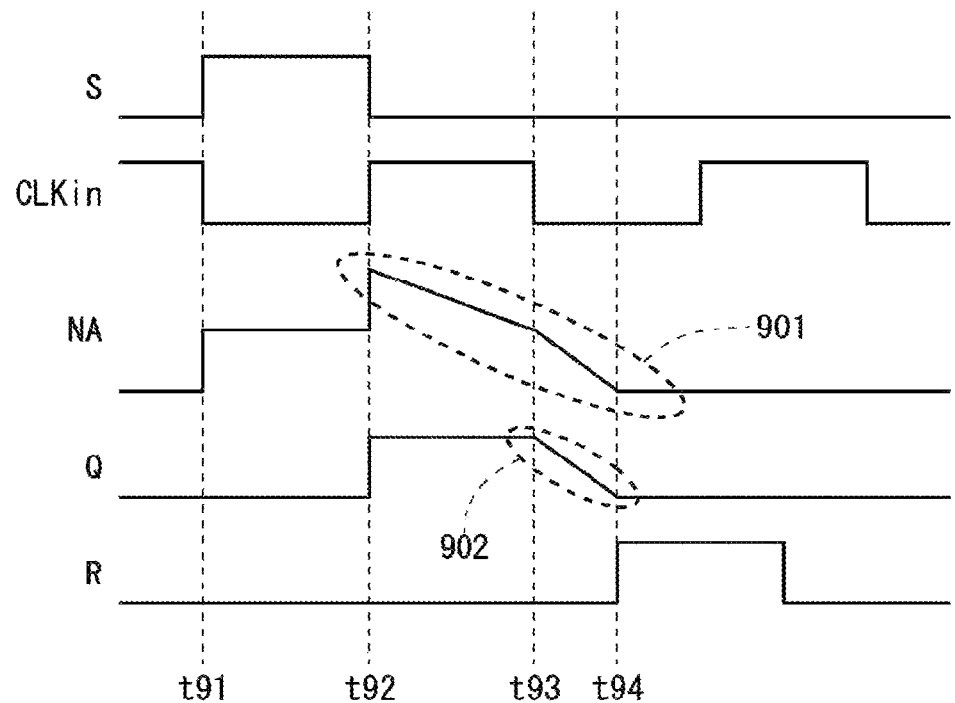
FIG. 17 is a signal waveform chart for explaining operational abnormalities that may occur in a conventional unit circuit.

In the conventional configuration shown in FIG. 15, the production of a leak current in the thin-film transistor T91 or T92 causes the potential of the control node NA to markedly drop from a desired potential as shown in FIG. 17 immediately before the point in time (point in time t93) where the input clock signal CLKin changes from a high level to a low level. Therefore, the potential of the output signal Q (i.e. the potential of the output terminal 49) gradually drops due to the drop in discharge capacity of the thin-film transistor T3. This causes an operational abnormality to occur.

Figure 7:
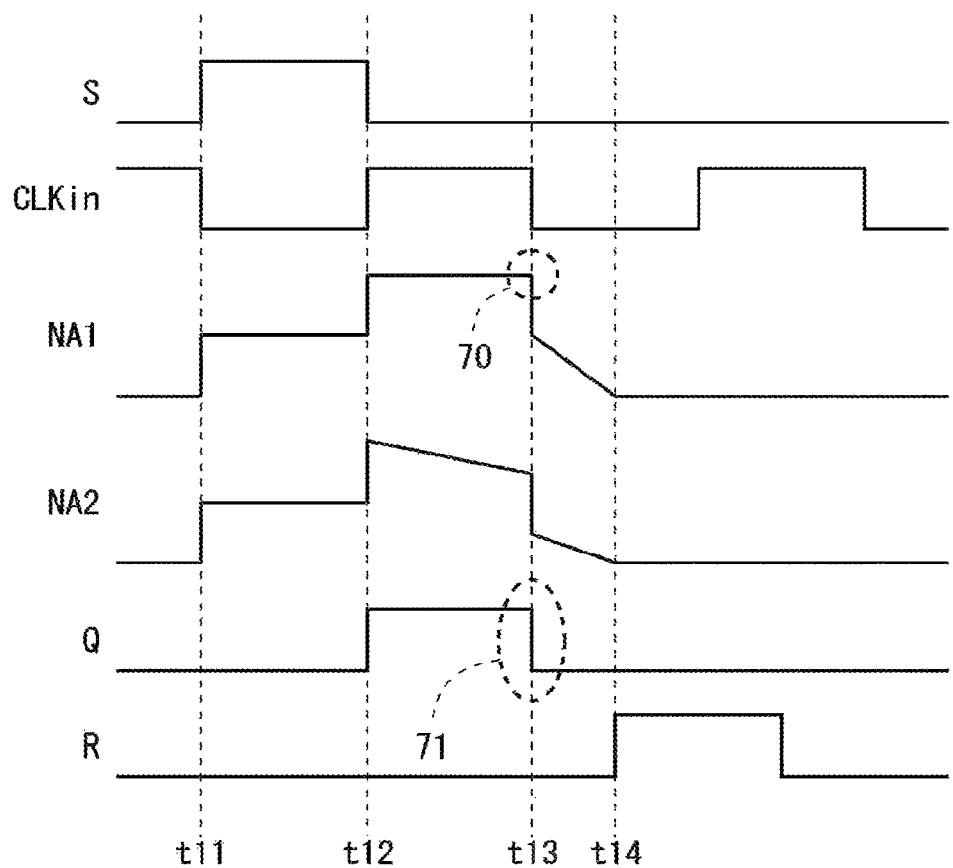
FIG. 7 is a signal waveform chart for explaining effects of the first embodiment.
Figure 18:
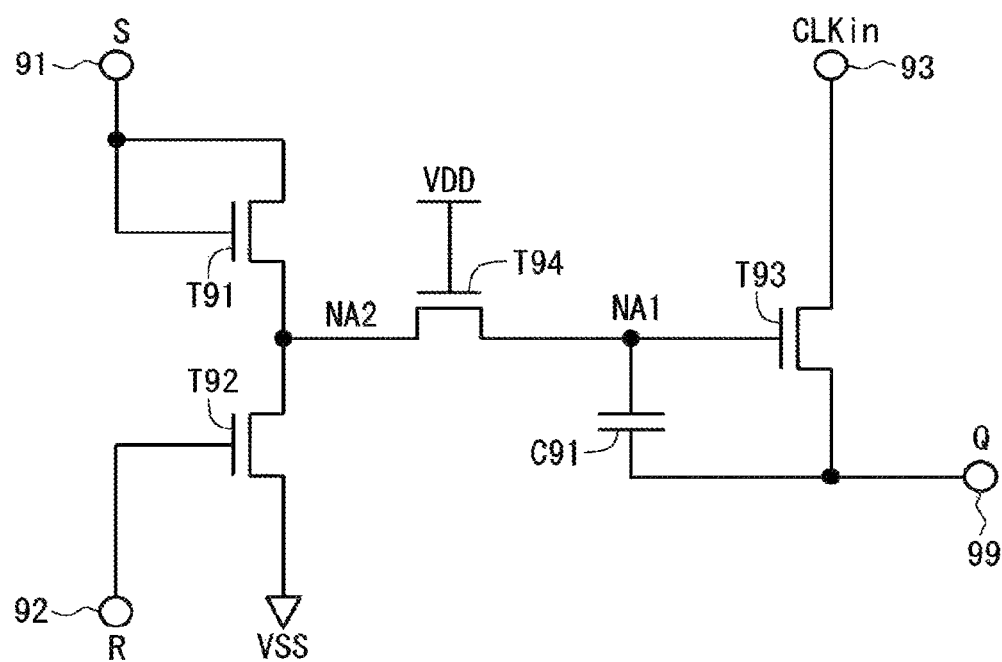
FIG. 18 is a circuit diagram showing a configuration of a unit circuit according to a conventional example provided with a thin-film transistor so that a control node is separated into two nodes.
Figure 19:
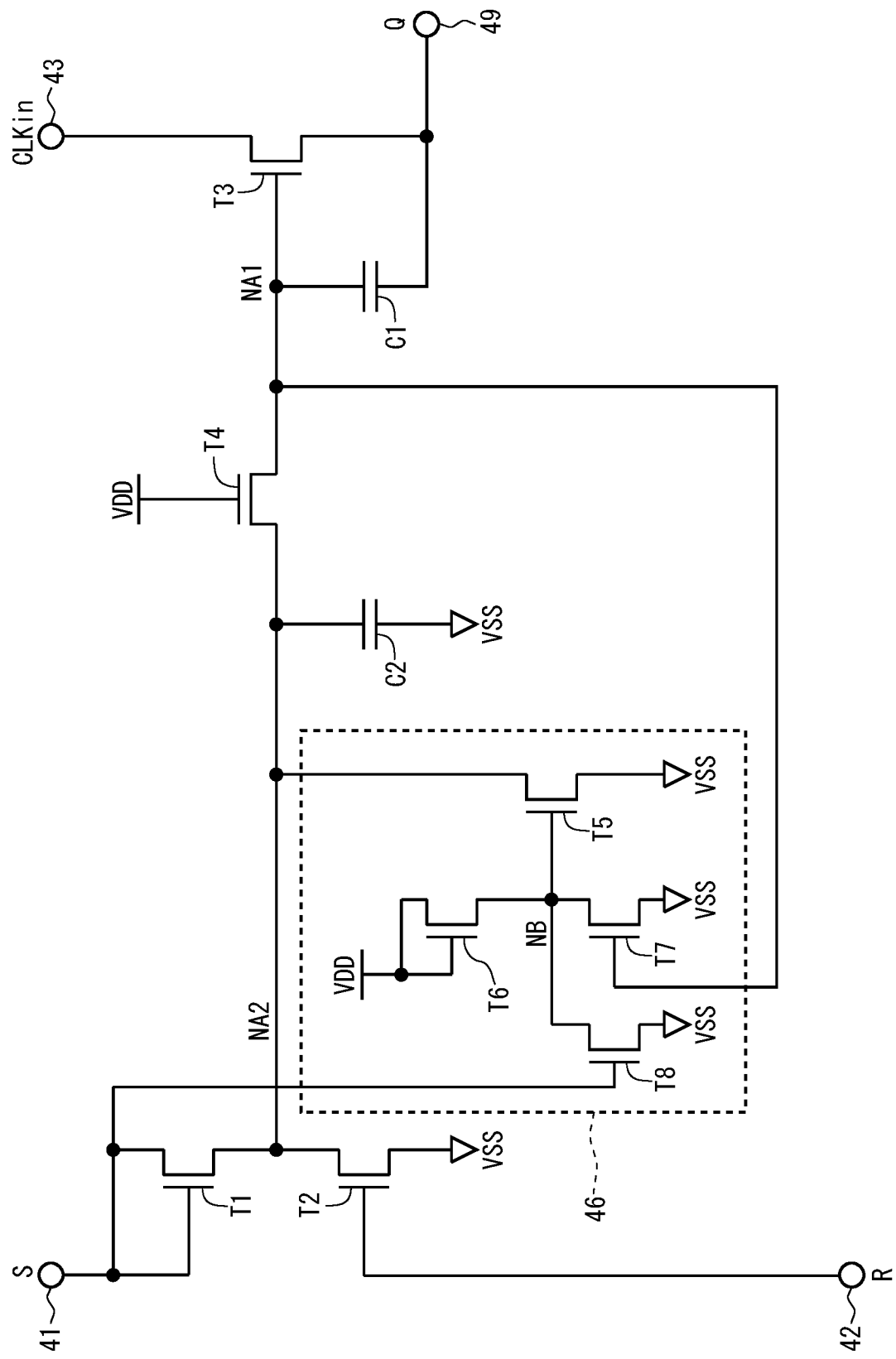
FIG. 19 is a circuit diagram showing a configuration of a unit circuit according to another example of the second embodiment and FIG. 20 is a circuit diagram showing a configuration of a unit circuit according to yet another example of the second embodiment.
Figure 20:
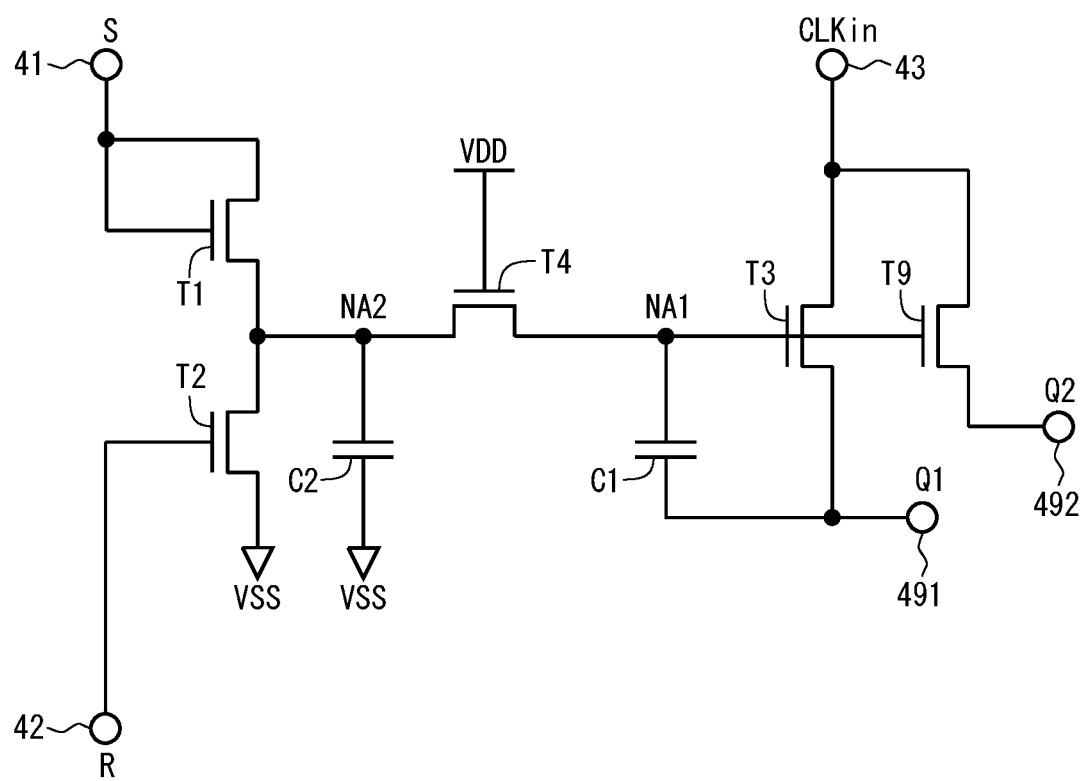

According to the present embodiment, on the other hand, as in the case of the conventional configuration shown in FIG. 18, the unit circuit 4 is provided with a thin-film transistor T4 that separates a control node (i.e. a node that controls output from the unit circuit 4) into an output-side first control node NA1 and an input-side second control node NA2, and the unit circuit 4 is further provided with a capacitor C2 whose first end is connected to the second control node NA2 and whose second end is connected to the output terminal 49. The capacitor C2 thus provided causes the potential of the second control node NA2 to rise as the potential of the output signal Q (i.e. the potential of the output terminal 49) rises. Note here that even if the potential of the second control node NA2 drops during the period from the point in time t12 to the point in time t13 in FIG. 6, due to the production of a leak current in the thin-film transistor T1 due to the change of the characteristics of the thin-film transistor T1 from enhanced characteristics to depression characteristics or a leak current in the thin-film transistor T2 due to the chancre of the characteristics of the thin-film transistor T2 from enhanced characteristics to depression characteristics, the thin-film transistor T4 is maintained in an OFF state provided the potential of the second control node NA2 is higher than "VDD-Vth" (where Vth is the threshold voltage of the thin-film transistor T4). Further, even if a leak current is produced, the potential of the second control node NA2 more gradually drops than in a configuration in which no capacitor C2 is provided, as the capacitor C2 is provided as mentioned above. For the reason noted above, as indicated by a portion denoted by reference sign 70 in FIG. 7, the potential of the first control node NA1 is maintained at a sufficiently nigh level immediately before the point in time (point in time t13) where the input clock signal CLKin changes from a high level to a low level. Therefore, as indicated by a portion denoted by reference sign 71 in FIG. 7, the potential of the output signal quickly drops in response to the change of the input clock signal CLKin from a high level to a low level. Further, even if the thin-film transistor T4 changes from an ON state to an OFF state, the potential of the output signal Q sufficiently drops before the potential of the first control node NA1 markedly drops in response to the drop in potential of the second control node NA2, as the channel width of the thin-film transistor T3 is ten or more times greater than the channel width of the thin-film transistor T4 as mentioned above and the thin-film transistor T3 is sufficiently higher in driving capacity than the thin-film transistor T4. It should be noted that no problem arises even if the potential of the first control node NA1 drops after the potential of the output signal Q has sufficiently dropped.

As noted above, the present embodiment achieves a shift register 410 that is Capable of restraining the occurrence of an operational abnormality attributed to a leak current in a thin-film transistor T1 or T2 whose conducting terminal (first conducting terminal or second conducting terminal) (drain or source) is connected to a control node.

3.2 Second Embodiment 3.2.1 Circuit Configuration

Figure 8:
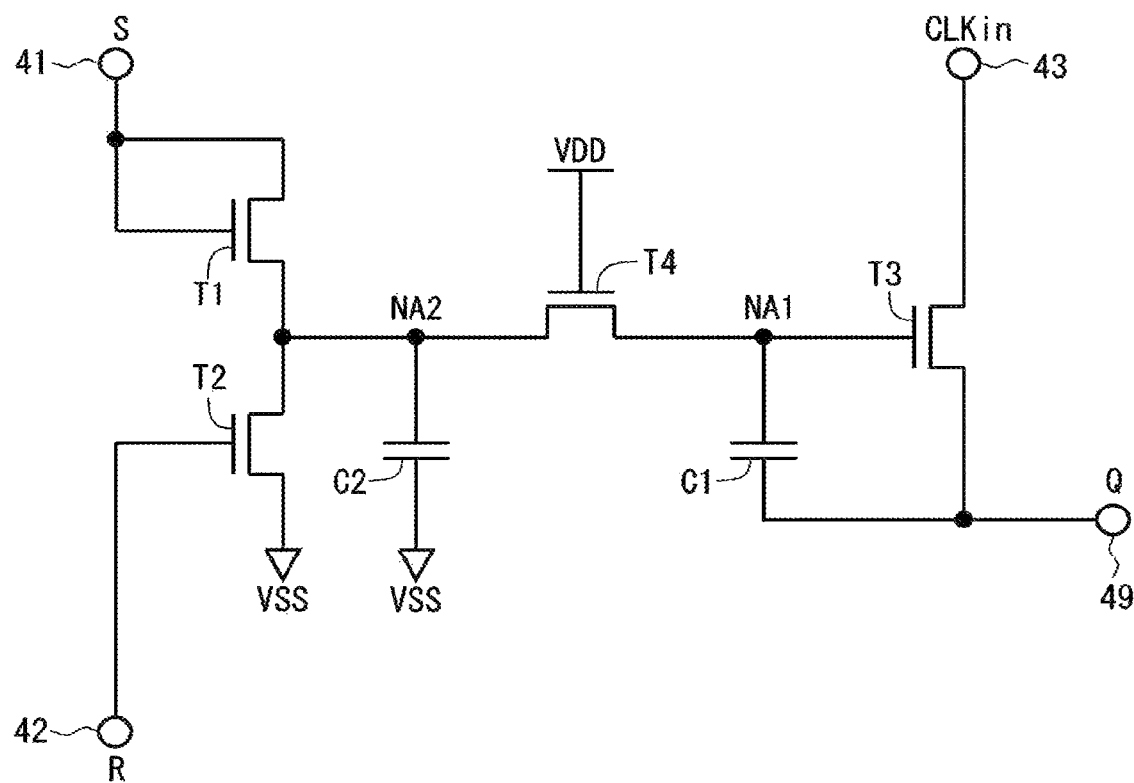
FIG. 8 is a circuit diagram showing a configuration of a unit circuit (i.e. a configuration of one stage of a shift register) according to a second embodiment.

FIG. 8 is a circuit diagram showing a configuration of a unit circuit 4 (i.e. a configuration of one stage of a shift register 410) according to the present embodiment. As in the case of the first embodiment, the unit circuit 4 includes four thin-film transistors T1 to T4 and two capacitors (capacitive elements) C1 and C2 Whereas the capacitor C2 has its second end connected to the output terminal 49 in the first embodiment, the capacitor C2 has its second end connected to the input terminal for a low-level DC power supply voltage VSS in present embodiment. In other respects, the present embodiment is e same as the first embodiment.

3.2.2 Operation

Operation of a unit circuit 4 according to the present embodiment is described with reference to FIG. 9. In a period preceding a point in time t21, the potential of the first control node NA1, the potential of the second control node NA2, and the potential of the output signal Q (i.e. the potential of the output terminal 49) are at a low level. It should be noted that in a period preceding the point in time t21, the thin-film transistor T4 is maintained in an ON state.

At the point in time t21, the set signal S changes from a low level to a high level. Since the thin-film transistor T1 is diode-connected as shown in FIG. 8, the change of the set signal S to a high level brings the thin-film transistor T1 into an ON state, so that the capacitor C2 is charged. This causes the potential of the second control node NA2 to change from a low level to a high level. At this point in time, since the thin-film transistor T4 in an ON state, the capacitor C1 is charged, so that the potential of the first control node NA1 changes from a low level to a high level too. This brings the thin-film transistor T3 into an ON state. Note here that during a period from the point in time t21 to a point in time t22, the input clock signal CLKin is maintained at a low level. For this reason, during this period, the output signal Q is maintained at a low level.

At he point in time t22, the set signal S changes from a hi level to a low level. This brings the thin-film transistor T1 into an OFF state. Further, at the point in time t22, the input clock signal CLKin changes from a low level to a high level. At this point in time, since the thin-film transistor T3 is in an ON state, the potential of the output terminal 49 rises as the potential of the input terminal 43 rises. Note here that since the capacitor C1 is provided between the first control node NA1 and the output terminal 49 as shown in FIG. 8, the potential of the first control node NA1 rises (that the first control node NA1 becomes boosted) as the potential of the output terminal 49 rises. As a result, a high voltage is applied to the thin fill transistor T3, and the potential of the output signal Q rises to a level sufficient for a gate bus line GL connected to the output terminal 49 to become selected. Incidentally, since the high-level DC power supply voltage VDD is supplied to the control terminal th thin-film transistor T4, the rises in potential of the first and second control nodes NA1 and NA2 in the period from the point in time t21 to the point in time t22 bring the thin-film transistor T4 into an OFF state at the point in time t22 (Note, however, that depending on the threshold voltage of the thin-film transistor T4, there is a case where the thin-film transistor T4 is brought into an OFF state at and after the point in time t22). Accordingly, the potential of the second control node NA2 does not rise even if the potential of the first control node NA1 rises at and after the point in time t22.

At a point in time t23, the input clock signal CLKin changes from a high level to a low level. This causes the potential of the output terminal 49 to drop as the potential input terminal 43 drops. That is, the potential of the output signal Q is brought to a low level. Further, the potential of the first control node NA1 drops via the capacitor C1.

At a point in time t24, the reset signal R changes from a low level to a high level. This brings the thin-film transistor T2 into an ON state, bringing the potential of the second control node NA2 to a low level. Further, the voltage between the control terminal and second Conducting terminal of the thin-film transistor T4 becomes higher than the threshold voltage, so that the thin-film transistor T4 is brought into an ON state. This brings the potential of the first control node NA1 to a low level too.

3.2.3 Effects

Figure 9:
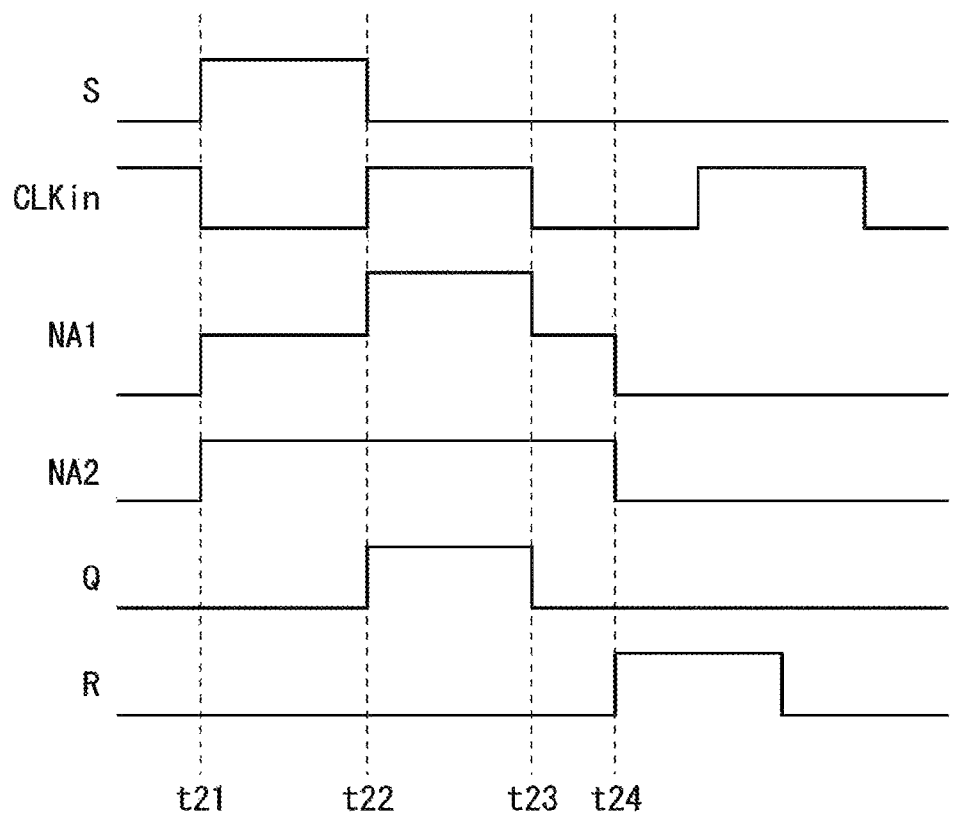
FIG. 9 is a signal waveform chart for explaining operation of a unit circuit according to the second embodiment.
Figure 10:
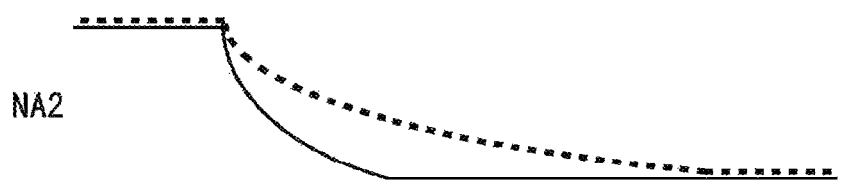
FIG. 10 is a signal waveform chart for explaining effects of the second embodiment.

According to the present embodiment, when the potential of the second control node NA2 drops during a period from the point in time t22 to the point in time t23 of FIG. 9 due to a leak current in the thin-film transistor T1 or T2, the potential of the first control node NA1 drops during the period too. However, even if a leak current is produced, the potential of the second control node NA2 more gradually drops than in a configuration in which no capacitor C2 is provided, as the unit circuit 4 is provided with a capacitor C2 whose first end is connected to the second control node NA2. For example, a configuration in which no capacitor C2 is provided, the potential of the second control node NA2 drops like a waveform indicated by a solid line in FIG. 10. On the other hand, in a configuration in which a capacitor C2 is provided (i.e. the configuration of the present embodiment), the potential of the second control node NA2 drops like a waveform indicated by a bold dotted line in FIG. 10. Accordingly, in the present embodiment, when a leak current is produced, the potential of the first control node NA1 gradually drops, so that the drop in discharge capacity of the thin-film transistor T3 is restrained. As noted above, according to the present embodiment, the occurrence of an operational abnormality attributed to a leak current a thin-film transistor T1 or T2 whose conducting terminal (first conducting terminal or second conducting terminal) (drain or source) connected to a control node (i.e. a control node that controls output from a unit circuit 4) is better restrained than in a configuration in which no capacitor C2 is provided.

Further, according to the present embodiment, even when the first control node NA1 becomes boosted at the point in time t22 of FIG. 9, the potential of the second control node NA2 is maintained at a potential it assumed immediately before the point time t22. Therefore, the application of a high voltage between the first conducting terminal and second conducting terminal (drain and source) of the in-film transistor T1 or T2 is restrained. This restrains the occurrence of an operational abnormality attributed to deterioration or breakdown of the thin-film transistor T1 or T2.

4. Examples of Application to Actual Circuits

The unit circuits 4 according to the first and second embodiments are unit circuits having basic configurations. However, unit circuits of various configurations are employed in actual display devices, and the contents of disclosure in the present specification can be applied to such unit circuits of various configurations. Accordingly, the following describes two examples (first and second examples) as examples of application to actual circuits.

4.1 First Example

It is often that a unit circuit 4 constituting a shift register 410 in a gate driver 400 is provided with a circuit for stabilization of operation (hereinafter referred to as "stabilization circuit"). Although there are various configurations of stabilization circuits, an example configuration of a unit circuit including a stabilization circuit is described here as the first example.

Figure 11:
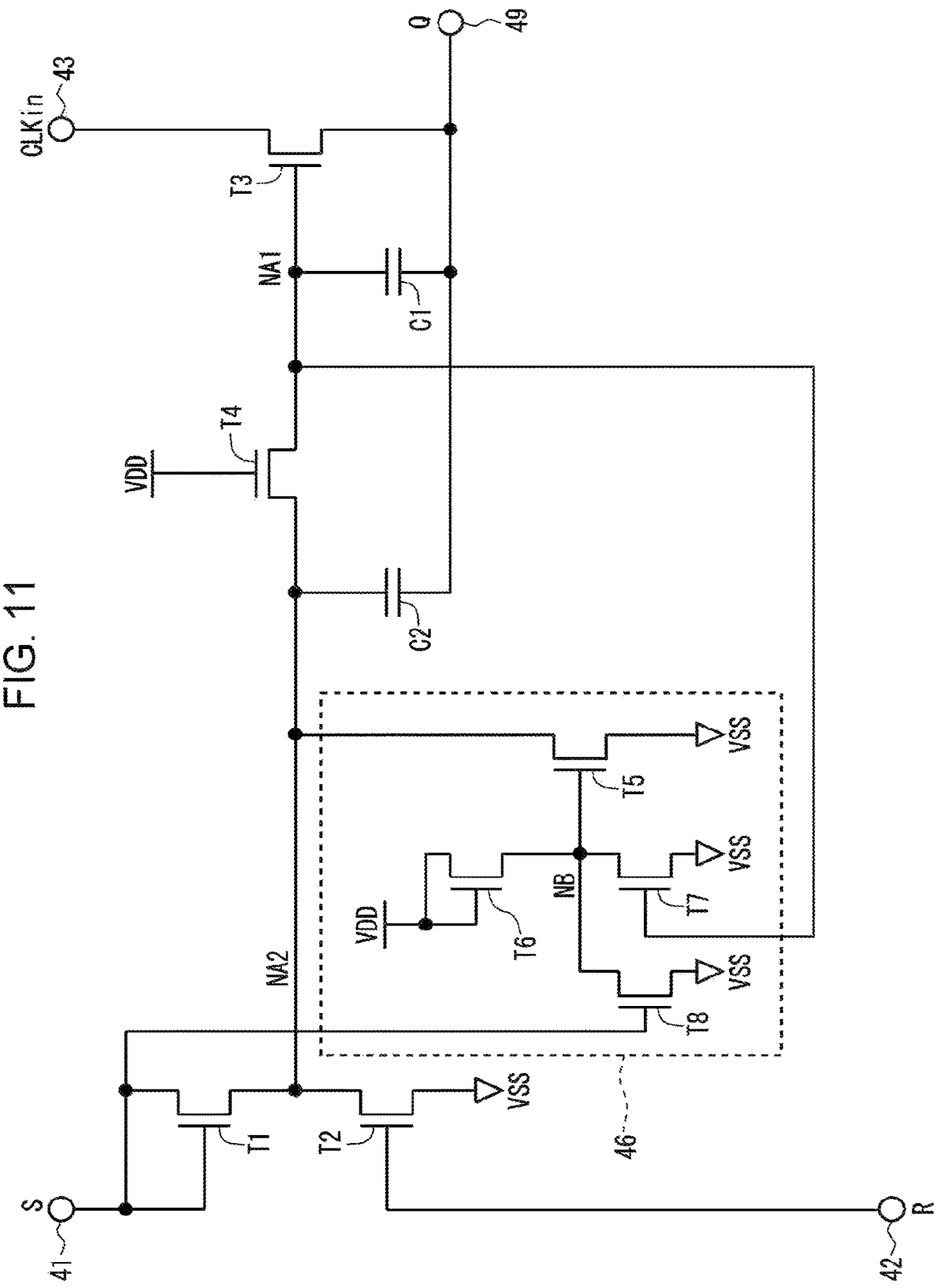
FIG. 11 is a circuit diagram showing a configuration of a unit circuit (i.e. a configuration of one stage of a shift register) according to a first example regarding application to an actual circuit.

FIG. 11 is a circuit diagram showing a configuration of a unit circuit 4 (i.e. a configuration of one stage of a shift register 410) according to the first example. A8 shown in FIG. 11, the unit circuit 4 includes eight thin-film transistors T1 to T8 and two capacitors (capacitive elements) C1 and C2. Further, this unit circuit has three input terminals 41 to 43 and one output terminal 49 as well as an input terminal for a low-level DC power supply voltage VSS and an input terminal for a high-level DC power supply voltage VDD. The control terminal of the thin-film transistor T5, the second conducting terminal of the thin-film transistor T6, the first conducting terminal of the thin-film transistor T7, and the first conducting terminal of the thin-film transistor T8 are connected to one another via a stabilization node NB.

The configuration of the thin-film transistors T1 to T4 and the capacitors C1 and C2 is similar to that of the first embodiment. Note, however, that as in the case of the second embodiment (see FIG. 8), the capacitor C2 may have its second end connected to the input terminal for a low-level DC power Supply voltage VSS. As for the thin-film transistor T5, the control terminal is connected to the stabilization node NB, the first conducting terminal is connected to the second control node NA2, and the second conducting terminal is connected to the input terminal for a low-level DC power supply voltage VSS. As for the thin-film transistor T6, the control terminal and the first conducting terminal are connected to the input terminal for a high-level DC power supply voltage VDD (i.e. diode-connected and the second conducting terminal is connected to the stabilization node NB. As for the thin-film transistor T7, the control terminal is connected to the first control node NA1, the first conducting terminal is connected to the stabilization node NB, and the second conducting terminal is connected to the input terminal for a low-level DC power supply voltage VSS. As for the thin-film transistor T8, the control terminal is connected to the input terminal 41 the first conducting terminal is connected to the stabilization node NB, and the second conducting terminal is connected to the input terminal for a low-level DC power supply voltage VSS. It should be noted that a stabilization circuit 46 is achieved by the thin-film transistors T5 to T8 and the stabilization node NB. Further a stabilization transistor is achieved by the thin-film transistor T5.

Figure 12:
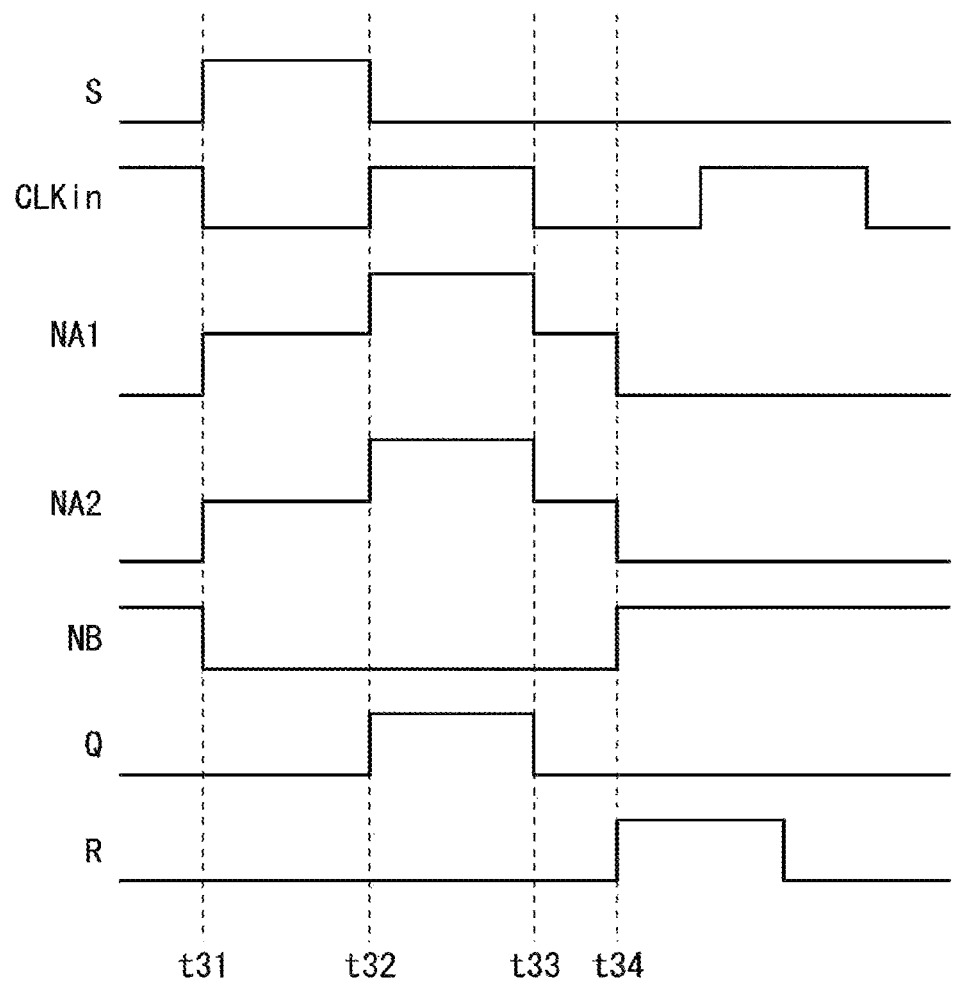
FIG. 12 is a signal waveform chart for explaining operation of a unit circuit according to the first example.

According to such a configuration, as shown in FIG. 12, the potential of the stabilization node NB is maintained at a high level in a period during which the potential of the first control node NA1 is supposed to be maintained at a low level, and the potential of the stabilization node NB is maintained at a low level in a period during which the potential of the first control node NA1 is supposed to be maintained at a high level. As a result, in a period preceding the point time t31 and a period following the point in time t34. In FIG. 12, the potential the second control node NA2 is certainly maintained at a low level by the thin-film transistor T5 being maintained in an ON state. In this way, the occurrence of an operational abnormality in the unit circuit 4 is restrained.

4.2 Second Example

In the first and second embodiments, the output signal Q outputted from each unit circuit 4 is supplied as a scanning signal G to the corresponding gate bus line GL, supplied as a reset signal R to the third previous unit circuit 4 to the unit circuit an supplied as a set signal S to the second subsequent unit circuit 4 to the unit circuit 4. Such a configuration raises concern that an abnormality may occur in operation of the unit circuit 4 due to the occurrence of blunting of the waveform of the reset signal R or the set signal S in a case where the load capacity of the gate bus line GL is markedly high. To address this problem, the following describes, as the second example, a configuration in which an output signal to serve as a scanning signal G and output signals to serve as a set signal S and a reset signal R are outputted from different output terminals so that the occurrence of such an abnormality is restrained.

Figure 13:
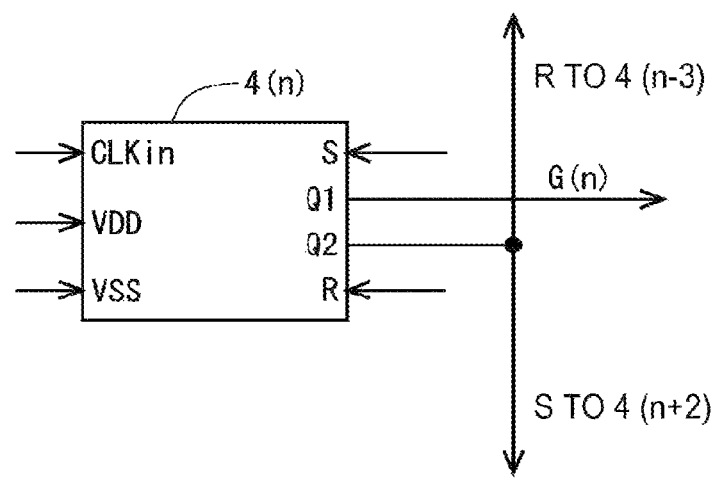
FIG. 13 is a diagram for explaining output signals from a unit circuit according to a second example regarding application to an actual circuit.

FIG. 13 is a diagram for explaining output signals from a unit circuit 4 according to tie second example. As shown 13, a first output signal Q1 and a second output signal Q2 are outputted as output signals from the unit circuit 4. A first output signal Q1 outputted from the nth unit circuit 4(n) is supplied as the scanning Signal G(n) to the gate bus line GLn. The same applies to a first output signal Q1 outputted from a unit circuit 4 other than the nth unit circuit 4(n). A second output signal Q2 outputted from the nth unit circuit 4(n) is supplied as a reset signal A to the third previous Unit circuit 4(n−3) to the nth unit circuit 4(n) and supplied as a set signal S to the second subseguent unit circuit 4(n+2) to the nth unit circuit 4(n). The same applies to a second output signal Q2 outputted from a unit circuit 4 other than the nth unit circuit 4(n).

Figure 14:
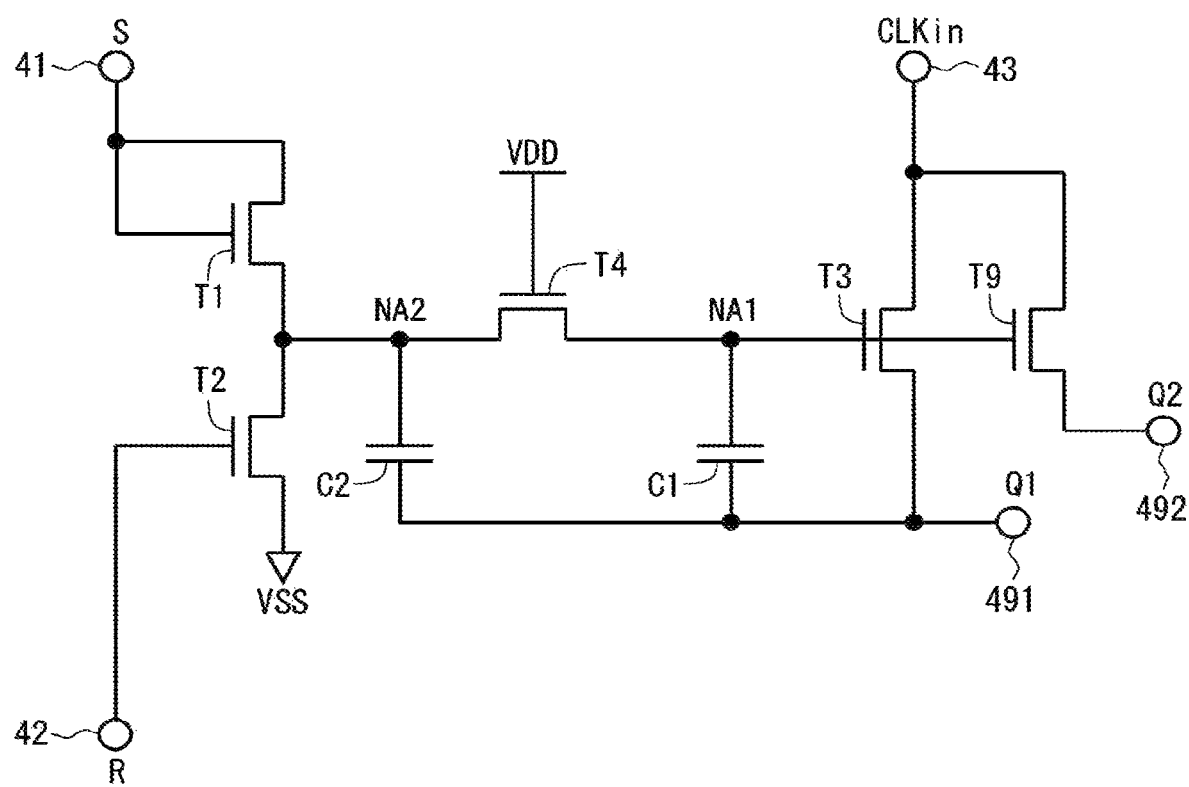
FIG. 14 is a circuit diagram showing a configuration of a unit circuit (i.e. a configuration of one stage of a shift register) according to the second example.

FIG. 14 is a circuit diagram showing a configuration of a unit circuit 4 (i.e. a configuration of one stage of a shift register 410) according to the second example. As shown in FIG. 14, the unit circuit 4 includes five thin-film transistors T1 to T4 and T9 and two capacitors (capacitive elements) C1 and C2. Further, this unit circuit has three input terminals 41 to 43 and two output terminals 491 and 492 as well as an input terminal for a low-level DC power supply voltage VSS and an input terminal for a high-level DC power supply voltage VDD. A first output signal Q1 is outputted from the output terminal 491. A second output signal Q2 is outputted from the output terminal 492.

As for the thin-film transistor T3, the control terminal is connected to the first control node NA1, the first conducting terminal is connected to the input terminal 43, and the second conducting terminal is connected to the output terminal 491. As for the thin-film transistor T9, the control terminal is connected to the first control node NA1, the first conducting terminal is connected to the input terminal 43, and the second conducting terminal is connected to the output terminal 492. As for the capacitor C1, the first end is connected to the first control node NA1, and the second end is connected to the output terminal 491. As for the capacitor C2, the first end is connected to the second control node NA2, and the second end is connected to the output terminal 491. In other respects, the present example is the same as the first embodiment. It should be noted that as in the case of the second embodiment (see FIG. 8), the second end of the capacitor C2 may be connected to the input terminal for a low-level DC power supply voltage VSS.

In the second example, a second output control transistor is achieved by the thin-film transistor T9, a first output node is achieved by tie output terminal 491, and a second output node is achieved by the output terminal 492.

The second example as noted above brings abort improvement in stability of circuit operation by causing an operation based on a set signal S and an operation based on a reset signal R to be promptly executed in each unit circuit 4 even. In a case where the load capacity of the gate bus line GL is markedly high.

5. Others

The foregoing detailed description of the present disclosure is not limitative but illustrative in all respects. It should be understood that a large number of changes and modifications can be devised without departing from the scope of the present disclosure. For example, although the foregoing description has taken a liquid crystal display device as an example, the foregoing contents of disclosure can also be applied to any display device (e.g. an organic EL display device) other than a liquid crystal display device that sequentially drives a plurality of gate bus lines (scanning signal lines).

The present disclosure contains subject matter related to that disclosed in Japanese Priority Patent Application JP 2021-211880 filed in the Japan Patent Office on Dec. 27, 2021, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A shift register comprising a plurality of stages that operates based on a plurality of clock signals,
wherein each of the plurality of stages comprises a unit circuit including
a first output node,
a first control node,
a second control node,
a first output control transistor having a control terminal connected to the first control node, a first conducting terminal that is supplied with an input clock signal that is one of the plurality of clock signals, and a second conducting terminal connected to the first output node,
a set transistor having a control terminal that is supplied with a set signal that is an output signal that is outputted from a unit circuit comprising a preceding stage, a first conducting terminal that is supplied with the set signal or an ON-level potential, and a second conducting terminal connected to the second control node,
a reset transistor having a control terminal that is supplied with a reset signal that is an output signal that is outputted from a unit circuit comprising a subsequent stage, a first conducting terminal connected to the second control node, and a second conducting terminal that is supplied with an OFF-level potential,
a separation transistor having a control terminal that is supplied with an ON-level potential, a first conducting terminal connected to the first control node, and a second conducting terminal connected to the second control node,
a first capacitor having a first end connected to the first control node and a second end connected to the first output node, and
a second capacitor having a first end connected to the second control node.

2. The shift register according to claim 1, wherein the second capacitor has a second end connected to the first output node.

3. The shift register according to claim 1, wherein the second capacitor has a second end that is supplied with an OFF-level potential.

4. The shift register according to claim 1, wherein a channel width of the first output control transistor is ten or more times greater than a channel width of the separation transistor.

5. The shift register according to claim 1, wherein
the unit circuit further includes a stabilization circuit for controlling a potential of the second control node, the stabilization circuit including a stabilization node and a stabilization transistor having a control terminal connected to the stabilization node, a first conducting terminal connected to the second control node, and a second conducting terminal that is supplied with an OFF-level potential,
a potential of the stabilization node is maintained at an ON level in a period during which a potential of the first control node is supposed to be maintained at an OFF level, and
the potential of the stabilization node is maintained at an OFF level in a period during which the potential of the first control node is supposed to be maintained at an ON level.

6. The shift register according to claim 1, wherein the unit circuit further includes
a second output node, and
a second output control transistor having a control terminal connected to the first control node, a first conducting terminal that is supplied with the input clock signal, and a second conducting terminal connected to the second output node, and
an output signal that is outputted from the second output node is supplied as the reset signal to a unit circuit constituting a preceding stage and supplied as the set signal to a unit circuit constituting a subsequent stage.

7. The shift register according to claim 1, wherein the set transistor and the reset transistor are thin-film transistors channel layers of which are formed by an oxide semiconductor.

8. The shift register according to claim 7, wherein the oxide semiconductor contains indium, gallium, zinc, and oxygen.

9. A scanning signal line driving circuit for driving a plurality of scanning signal lines disposed in a display section that displays an image, the scanning signal line driving circuit comprising the shift register according to claim 1,
wherein the plurality of stages comprises a plurality of unit circuits provided in a one-to-one correspondence with the plurality of scanning signal lines, and
the first output node included in each of the plurality of unit circuits is connected to a corresponding scanning signal line.

10. A display device comprising:
the display section according to claim 9 that displays the image; and
the scanning signal line driving circuit according to claim 9.

* * * * *